United States Patent
Bordeleau et al.

(10) Patent No.: US 9,337,861 B2
(45) Date of Patent: May 10, 2016

(54) METHOD AND SYSTEM FOR GENERATING A DATA SET

(75) Inventors: Francois Bordeleau, Brossard (CA); James Mood, Mansfield, MA (US); Pierre Duhamel, Boucherville (CA)

(73) Assignee: PRATT & WHITNEY CANADA CORP., Longueuil (CA)

( * ) Notice: Subject to any disclaimer, the term of this patent is extended or adjusted under 35 U.S.C. 154(b) by 216 days.

(21) Appl. No.: 13/213,446

(22) Filed: Aug. 19, 2011

(65) Prior Publication Data

US 2012/0046804 A1  Feb. 23, 2012

Related U.S. Application Data

(60) Provisional application No. 61/375,577, filed on Aug. 20, 2010.

(51) Int. Cl.
*G06F 7/00* (2006.01)
*H03M 7/30* (2006.01)

(52) U.S. Cl.
CPC .................... *H03M 7/3059* (2013.01)

(58) Field of Classification Search
CPC ............................ G05D 1/0274; G05D 1/0278
USPC ......... 701/3, 14, 32.1, 37, 50, 51, 54, 84, 120
See application file for complete search history.

(56) References Cited

U.S. PATENT DOCUMENTS

| | | | | |
|---|---|---|---|---|
| 4,669,097 A | * | 5/1987 | Bristol | ........................ 375/240 |
| 2007/0150170 A1 | * | 6/2007 | Deker | ........................ 701/120 |

OTHER PUBLICATIONS

James, Peter A.; Data Compression for Process Historians; 1995; Chevron Research and Technology Company.

* cited by examiner

*Primary Examiner* — Redhwan k Mawari
*Assistant Examiner* — Rodney P King
(74) *Attorney, Agent, or Firm* — Norton Rose Fulbright Canada LLP

(57) ABSTRACT

Systems, methods, and stored coded instruction sets for reducing the amount of data captured, i.e., retained, by a computerized system, such as an aircraft flight control or monitoring system. Such systems can, for example, be used in monitoring and/or controlling the operation of one or more aircraft engines, flight controls, or other aircraft systems, in order to optimize storage required for collected data, and/or to reduce or otherwise control the time required to off-load captured data to another computer system, such as a land-based analysis system. The amount of data collected, e.g., captured or retained in memory, may be reduced by discarding data points that are within a specified tolerance of, for example, a previously observed or expected value in a manner which assists with preserving the accuracy and precision of the original measured data.

9 Claims, 9 Drawing Sheets

METHOD AND SYSTEM FOR GENERATING A DATA SET

TECHNICAL FIELD

The disclosure relates generally to the generation of data sets, and more particularly to the generation of data sets representing sensed physical parameters, the data sets of relatively limited or controlled size.

BACKGROUND OF THE ART

It is desirable that aircraft systems be able to transmit full data, including for example full flight data, while on the ground at an airport, maintenance depot, or in similar circumstances, to one or more ground-based stations for further analysis or storage. One manner in which data may be transmitted from such aircraft is through a cellular telephone modem, WiFi, or other wireless connection, including particularly wireless channels having relatively limited bandwidth.

The time available for data transmission may be limited in some scenarios by factors such as the amount of time that electrical power is available to an aircraft during pre- and post-flight periods while on the ground. Therefore, it may be desirable to transmit all desired flight data within such a limited time window. It is also understood that the bandwidth available for data transmission is often limited by the means of transmission selected. For example, relatively low bandwidth may be available if transmission is to done accomplished through a network such as the that associated with a typical cellular connection. Available data compression techniques, however, do not usually reduce the data enough to allow transmission of full flight data, or all flight data otherwise desired, through a cellular modem in the pre- and post-flight time available.

Improvement in the generation of data sets of reduced, or otherwise controlled, size is therefore desirable.

SUMMARY

In various aspects and embodiments the disclosure provides systems, methods, and computer-readable media for the generation and storage of data sets of relatively reduced or otherwise controlled size, and to memories storing such data sets.

In one aspect, for example, the present description discloses systems and methods for reducing the amount of data captured, i.e., retained, by a computerized system, such as an aircraft flight control or monitoring system. Such systems can, for example, be used in monitoring and/or controlling the operation of one or more aircraft engines, flight controls, or other aircraft systems, in order to optimize storage required for collected data, and/or to reduce or otherwise control the time required to off-load captured data to another computer system, such as a land-based analysis system. The amount of data collected, e.g., captured or retained in memory, may be reduced by discarding data points that are within a specified tolerance of, for example, a previously observed or expected value in a manner which assists with preserving the accuracy and precision of the original measured data.

For example, the amount of data captured may be relatively reduced, or "compressed", based on observed changes in data values. Such data reduction methods can reduce the size of a resultant memory store, such as a data file, by considering both the data value itself and a tolerance band on either side of the data value, as will be described further below, and capturing, or retaining, data by storing in persistent or other non-transient memory only those data which represent values within an expected or otherwise acceptable tolerance compared to previously-observed data.

For example, systems in accordance with the disclosure can compute slopes of curves representing captured and/or extrapolated, or otherwise anticipated, data values, and of curves representing bands within deemed acceptable tolerances of such data values, in such manner as to ensure that a corresponding compression error is equal or less than the selected tolerance value, in order to optimize the deletion of measured data points without affecting the accuracy of the overall data set. Deletion in such sense may include omission of transfer of data held in buffers or other volatile memory to persistent or non-transient memory.

In further aspects, the disclosure provides corresponding methods and computer-readable media comprising coded instruction sets.

DESCRIPTION OF EMBODIMENTS

Reference is now made to the accompanying drawings, in which.

DETAILED DESCRIPTION OF EMBODIMENTS

Embodiments of systems, method, and media in accordance with the disclosure are described through reference to the drawings.

Figure 1:
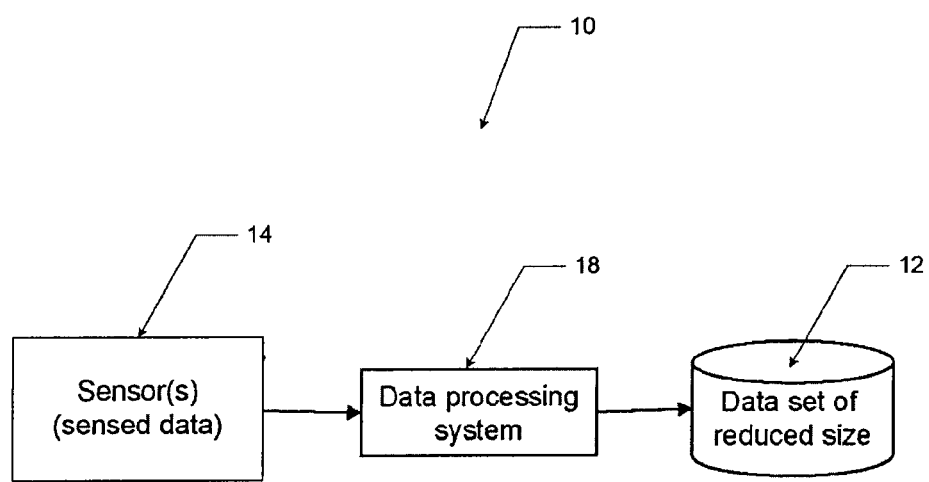
FIGS. 1 and 2 are schematic diagrams of embodiments of systems for generating data in accordance with the disclosure.

FIG. 1 is a schematic diagram of an embodiment of a system 10 useful for generating data set or sets 12 in accordance with the disclosure. In the embodiment shown, system 10 comprises one or more data processors, or other data processing systems, 18, sensors 14 such as pitot tubes, tachometers, pressure sensors, accelerometers, strain gauges, temperature gauges, etc. and memory(ies) 12, which may include one or more transient and/or persistent machine-readable memories of any type or form suitable for the application contemplated and consistent with the disclosure herein. A data processing system 10 may be configured to read sensed data provided by sensor(s) 14 and to determine values to be included in one or more data sets stored in memory(ies) 12 in accordance with processes disclosed herein. Accordingly, data processing system 10 may be configured to perform one or more data reduction operation(s), as described herein, so that data set 12 may be of relatively reduced or otherwise controlled size, and only include meaningful or otherwise selected or desired data entries derived from data provided by sensors 14.

As will be understood by those skilled in the relevant arts, once they have been made familiar with this disclosure, data processor(s) 18 may be of any type(s) suitable for the purposes disclosed herein. For example, either general-purpose electronic data processors executing electromagnetically stored, machine-readable instruction sets to implement software-coded solutions, and/or special-purpose electronic signal and/or data processors performing specific hard-wired functions, will serve.

Sensed-data generators 14 may comprise any one or more sensors suitable for generating data signals representing physical parameters of interest. As noted above, systems and methods according to the disclosure herein may be applied advantageously to systems generating large amounts of data which may need to be transmitted over communications lines having relatively limited bandwidth. For example, such systems and methods can be applied with particular advantage to systems configured for monitoring one or more systems or components installed on or otherwise incorporated in or associated with an aircraft, and/or for downloading stored data representing one or more pressures (e.g., atmospheric, inlet, oil, etc.), temperatures, accelerations, strains, rotational speeds, torque, etc. Accordingly, systems and methods implemented in accordance with the disclosure can be implemented using pitot tubes, tachometers, pressure sensors, accelerometers, strain gauges, temperature gauges, and other types of sensors known, or later to be developed, and used and/or useful in monitoring any of a very wide variety of aircraft systems and components.

As noted above, memory(ies) 12 may include any one or more volatile and/or persistent electromagnetic data storage device(s) suitable for implementing the purposes disclosed herein for a desired application(s), including for example including read-only, read/write, or other memories, buffers, databases, etc.

Figure 2:
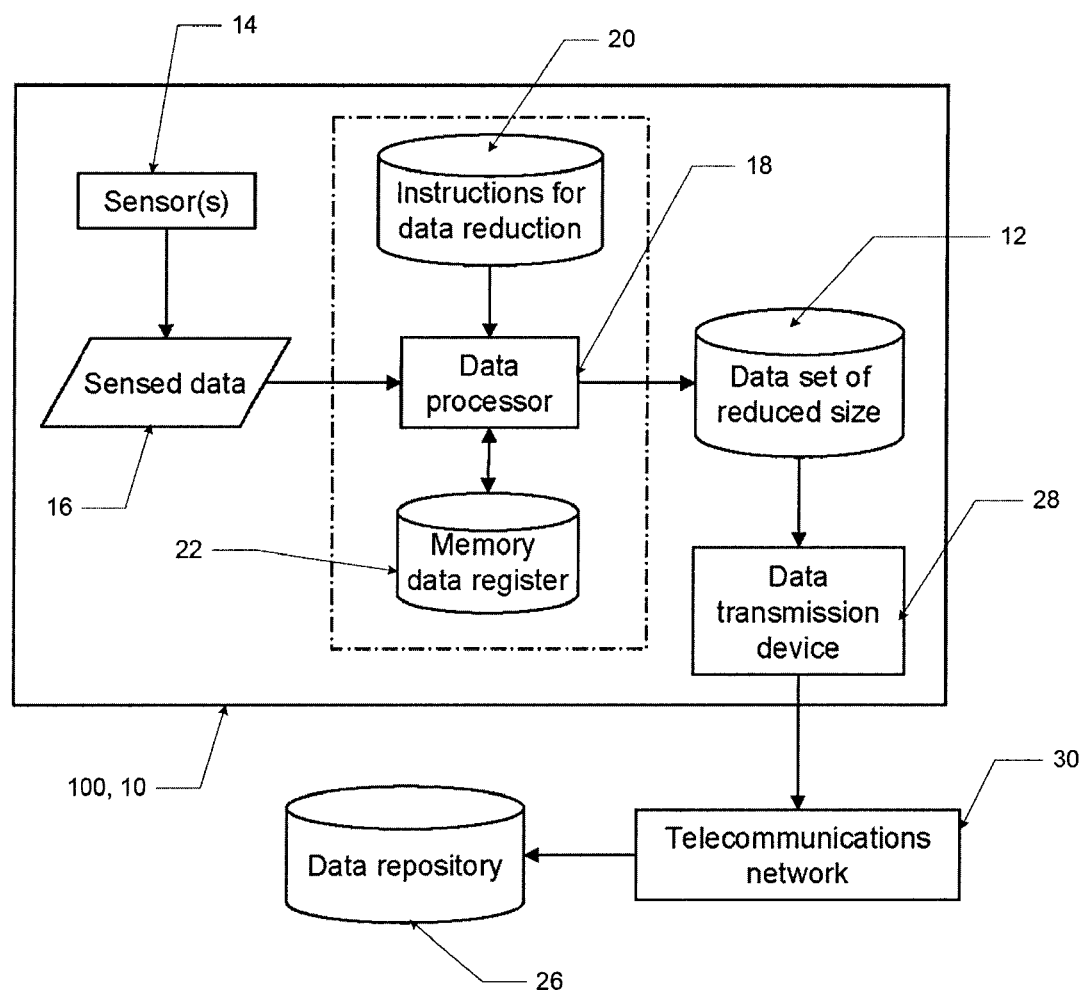

FIG. 2 illustrates another embodiment 100 of a data processing system 10 suitable for use in implementing processes according to the disclosure, including for example on or in association with a vehicle or other mobile platform such as an aircraft. A data processing system 10, 100 may include one or more data processor(s) 18 and, for example, particularly where data processor(s) 18 include one or more programmed general-purpose data processing circuits, computer-readable memory(ies) 20 and/or 22. Memory(ies) 20 may include means for storing machine-interpretable instructions for access by processor(s) 18. Such instructions may, for example, be encoded as software using, for example, any suitably-configurable, known programming language(s); and/or may be hard wired using for special-purpose chips or circuit boards. Memory(ies) 22 may for example include one or more memory data registers in the form of random access memory (RAM) acting as a buffer and holding data ready to be used by data processor(s) 18; including, for example, for transfer to data store(s) 12.

Data processing system(s) 10, 100 may be configured to receive data 16 provided by sensors 14 and generate data set(s) 12 based on coded machine-readable instructions (e.g., software) provided in memory(ies) 20. Sensed data 16 may for example include a stream of signals generated (e.g., continuously or continually, in real time) by one or more sensor(s) 14 used to monitor one or more parameters associated with, for example, one or more systems of an aircraft or other vehicle. As noted above, sensor(s) 14 used in gathering data to be processed may be of any suitable known or specially-developed type. Sensor(s) 24 may be useful, for example, in sensing and generating signals representing temperatures, pressures, rotational speeds, flow rates, or various forms of forces. Sensed data 16 may be provided to data processing system(s) 10, 100 continuously, in "real" time, or may have been previously sensed and then stored in suitable computer readable memory(ies) such as memory(ies) 20 for future processing by data processor(s) 18.

Data set(s) 12 may be transmitted from, for example, a system 100, 10 aboard an aircraft to one or more data repository(ies) 26 via data transmission device(s) 28 and telecommunications network(s) 30. Data transmission device(s) 28 and network(s) 30 may include any wired or wireless data transmission means suitable for use in implementing the processes disclosed herein. For example, data transmission device(s) 28 may include one or more cellular telephone or other modems. Telecommunications network(s) 30 may include, for example, a cellular-based communications network or a satellite-based communications system (e.g. SATCOM).

Data repository(ies) 26 may include one or more computer-readable memory(ies) located at one or more ground-based stations, and may be used for volatile and/or persistent storage of data set(s) 12. A suitable ground station may, for example, include facilities of or otherwise associated with an aircraft system's manufacturer, an airline's owner/operator, and/or a third-party service provider for an aircraft or any system(s) or subsystem(s) thereof. Data set(s) 12 may be used, for example, for diagnostics and/or performance monitoring of systems or subsystems of an aircraft or other vehicle. Data set(s) 12 may, for example, comprise data relating to the performance and/or operation of one or more engines such as gas turbine engines (not shown) mounted to aircraft, in which case data one or more transmission devices 28 may be mounted directly to the engine or to any suitable location on aircraft.

During operation, data processing system(s) 10, 100 perform data reduction operation(s) on data generated using signals received from sensor(s) 14, based on execution of machine-readable instructions stored in and accessed from memory(ies) 20 to generate data set(s) 12 having reduced or otherwise controlled sizes, relative to amounts of "raw" data generated by and/or received by processor(s) 18 from sensor(s) 14, such that the generated data set(s) 12 may not include data representing the full set of signals generated and/or provided by sensor(s) 14. Some data entries generated by sensor(s) 14 may be omitted from data set 12 if they are determined not to be meaningful, or are sufficiently predictable (using, for example, known interpolation schemes) based on predetermined criteria. Accordingly, data set(s) 12 may, for example, be of size(s) suitable for transmission within a limited time window such as during pre- and post-flight periods while an aircraft is on the ground, using systems of finite transmission bandwidth.

Figure 3:
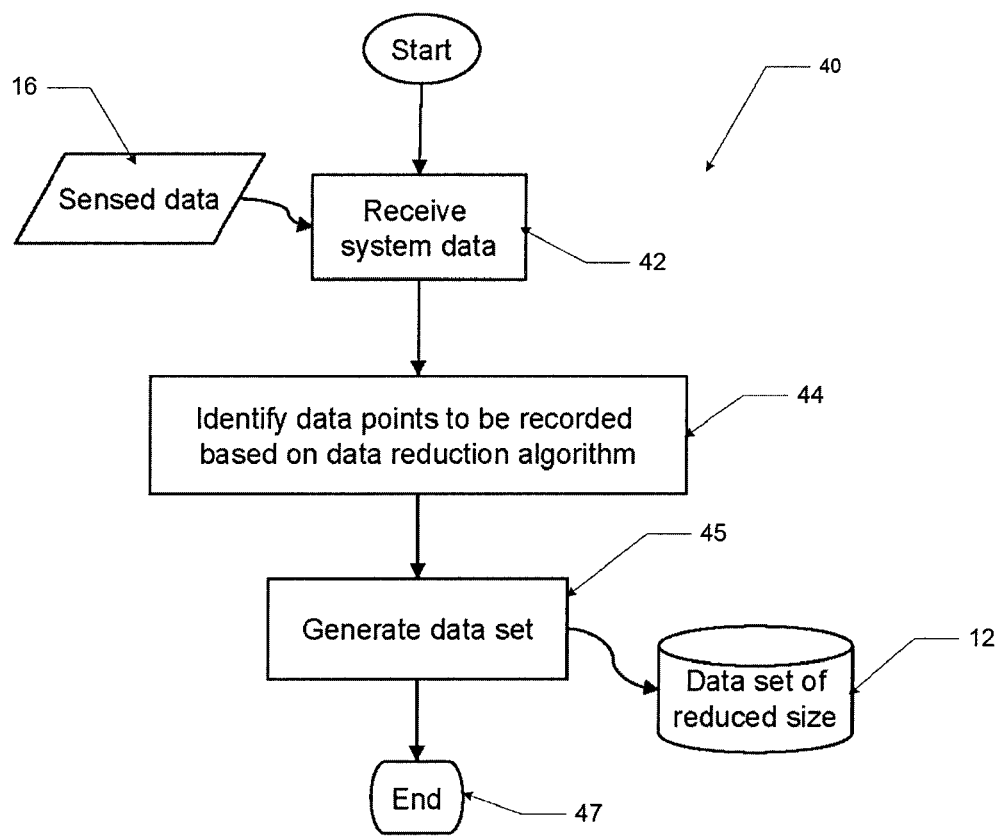
FIGS. 3-6 are schematic flowcharts illustrating embodiments of processes suitable for use in generating data sets in accordance with the disclosure.

FIG. 3 illustrates an embodiment of a method 40 which may be used to generate a data set 12 in accordance with the disclosure. Such a method 40 may be performed by data processing system(s) 10, 100. In the embodiment shown, a method 40 includes receiving, at 42, data generated by one or more sensors; identifying, at 44, from a set of received signals 16 one or more data points representing signals 16 meeting desired criteria to be recorded or otherwise retained in a data set of relatively reduced size for later processing; and at 46 generating a relatively reduced data set 12 to be stored in volatile or persistent memory.

Figure 4:
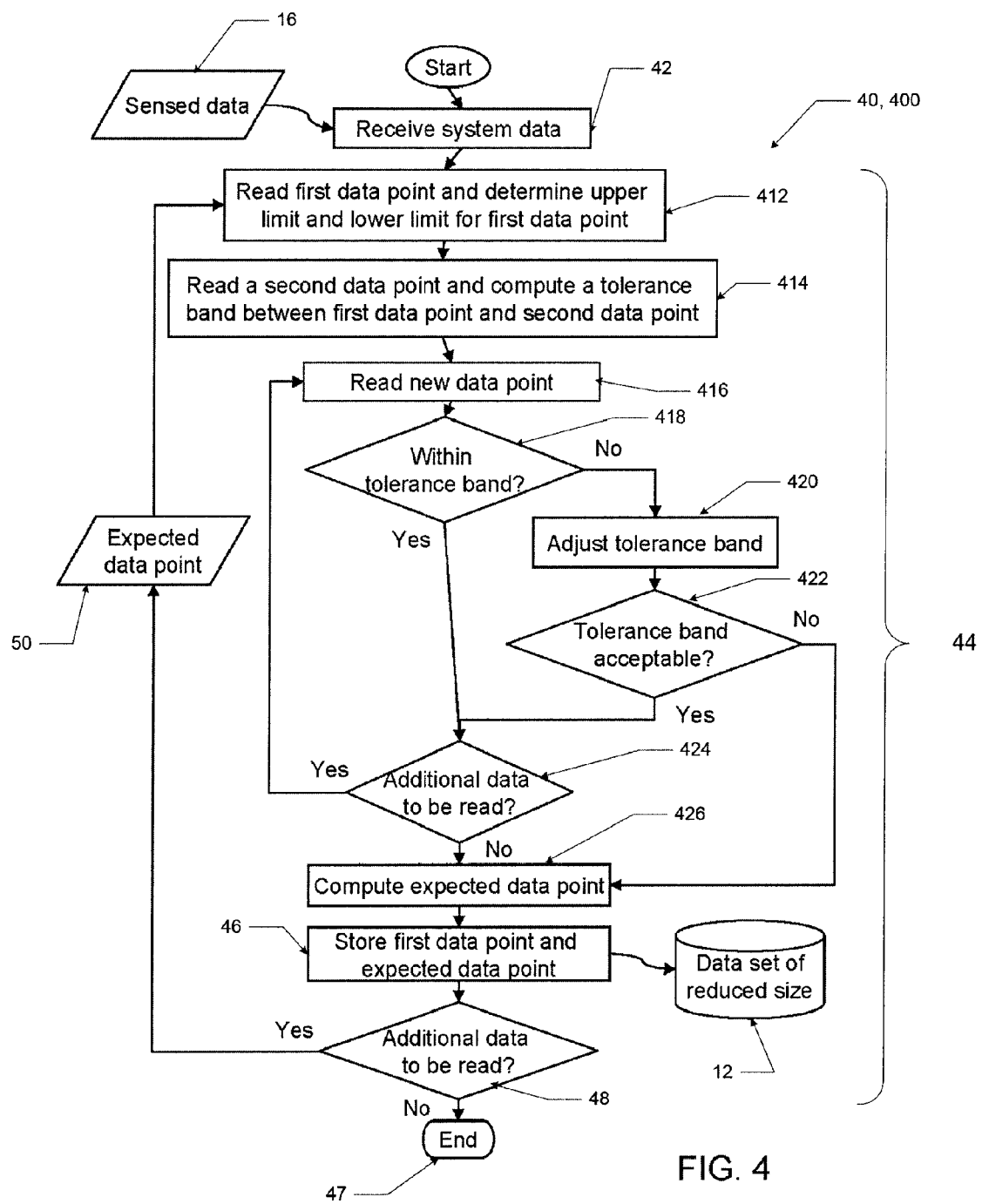

FIG. 4 illustrates another embodiment 400 of a method 40 which may be used to generate a data set 12 in accordance with the disclosure. Such a method 40, 400 may be performed by data processing system(s) 10, 100. In the embodiment shown, a method 400 includes receiving, at 42, data generated by one or more sensors; identifying, at 44, from a set of received signals 16 a stream or other set of data points representing signals 16 meeting desired criteria to be recorded or otherwise retained in a data set of relatively reduced size for later processing; and generating, at 46, a relatively reduced data set 12 to be stored in volatile or persistent memory.

In the embodiment shown in FIG. 4, a specific embodiment of identifying 44, from a set of received signals 16, a stream or other set of data points representing signals 16 meeting desired criteria to be recorded or otherwise retained in a data set of relatively reduced size is shown. In the embodiment shown, identifying 44 comprises reading or otherwise accessing a stream or other set of data points representing signals 16 and determining, on a point by point basis, whether each point should be stored in a set 12 of data selected for retention and/or further processing.

For example, as noted above, data processing system(s) 10, 100 perform data reduction operation(s) on data generated using signals received from sensor(s) 14, based on execution of machine-readable instructions stored in and accessed from memory(ies) 20, such that the generated data set(s) 12 may not include data representing the full set of signals generated and/or provided by sensor(s) 14. Some data entries generated by sensor(s) 14 may be omitted from data set 12 if they are determined not to be meaningful, or are sufficiently predictable (using, for example, known interpolation schemes) based on predetermined criteria such as previously determined thresholds stored in memory(ies) 20, as for example using table look-up or other means, or determined dynamically based on existing criteria such as current flight or operating conditions.

Accordingly, at 412 a first data point P0 may be generated, and associated with appropriate upper and lower tolerance or threshold limits. For example, a first signal representing a parameter value V0 at a time T0, such as a pressure, temperature, rotational speed, torque, etc., may be read and, if or as necessary, converted by suitable multiplication or other transformation into a data point P0 representing the value V0 of the parameter at the time the signal was generated, T0, such that:

$$P0 = (V0, T0)$$

where $$P0 = \text{signal value (in volts)} * \text{conversion factor}$$

and

Conversion factor=volts/unit parameter value

Depending, for example, upon the nature of the parameter read (e.g., whether it represents a pressure, temperature, torque, etc.), a tolerance band may be established by reading or otherwise determining an acceptable or otherwise appropriate limit of variation, or tolerance limit, to be tolerated in subsequent parameter data values V without triggering storate of corresponding data points, and using such tolerance limit to determine points $t_u$, $t_1$ associated upper and lower values of tolerance limits at the first-read data point:

$$t_{u0} = V0 + \text{tolerance limit}$$

$$t_{l0} = V0 - \text{tolerance limit}$$

Tolerance limits suitable for use in implementing the invention may be determined using any known or subsequently-developed methods consistent with the purposes disclosed herein. As will be understood by those skilled in the relevant arts, for example, a suitable tolerance limit may be determined depending upon the nature of the parameter monitored, current, expected, or desired operating conditions, acceptable risk factors, etc. Once they have been determined, suitable tolerance limits may be stored in any suitable form or format in memory(ies) 20 for access by processor(s) 18. Alternatively, suitable tolerance limit equations may be identified, and parameters useful by processor(s) 18 in determining variable tolerance limits may be so stored, and accessed by processor(s) 18 for determining tolerance limits at the time of execution, e.g., in real time.

At 414, a signal representing a second data point P1 associated with a value V1 at a time T1 may be read, and tolerance band may be established, and.or it may be determined whether P1 falls within a previously-determined tolerance band established using the value V0 of data point P0 and the slope of a line extrapolated using previously-considered or otherwise anticipated data. For example, upper and lower tolerance boundary lines may be constructed by determining suitable slopes and intercepts to provide parameters describing corresponding lines; and such parameters may be extrapolated from T0 to time T1, to give upper and lower values $$t_{u1} = t_{u0} + \text{boundary slope} * (T1 - T0)$$

$$t_{l1} = t_{l0} + \text{boundary slope} * (T1 - T0)$$

Such that if $$t_{l1} \leq V1 \leq t_{u1}$$

point P1 may be ignored. That is, V1 may not be written from operating memory of processor(s) 18 to data set 12. If, however, $$V1 > t_{u1};$$

or $$V1 < t_{l1};$$

data representing P1 may be written to data set 12 for later processing.

Thereafter a series of subsequent data points may be read, and for each such point a determination may be made whether the point falls within a currently-established tolerance band. If the point does fall within such a band, it may not be stored to set 12; if it falls outside such a band, it may be stored within a set 12.

For example, at 416 a subsequent data point P2 representing a parameter value of interest V2 at time T2 may be read, and a at 418 a determination may be made whether P2 falls within the tolerance band of expected data values, as determined at 414. If the value of V2 at time T2 falls within the expected tolerance band, the point P2 may be ignored by not writing it to data set 12 and at 424 a next data point may be read.

Figure 5:
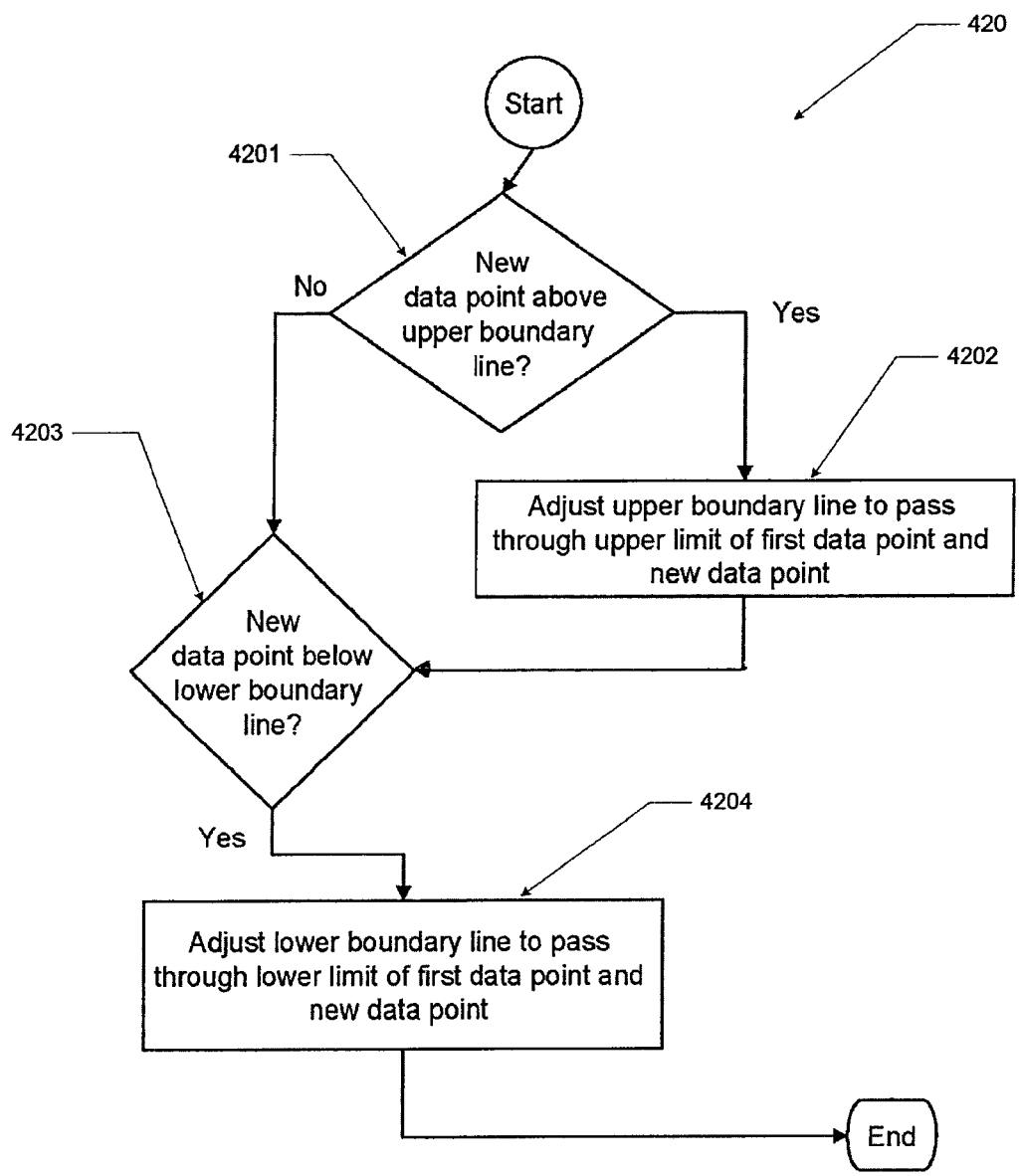

If the value of V2 at time T2 falls outside the expected tolerance band, at 420, 422 a determination may be made whether the tolerance band should be adjusted. As shown in FIG. 5, this may, for example, be accomplished by calculating, at 420, 4202, 4204, a new tolerance band consisting of upper and lower boundaries at least containing point P2. For example, if V2 is greater than upper value of the tolerance band at time T2, the slope of the upper boundary line may be increased to pass through P2, while the slope of the lower boundary line is left constant. If the value of V2 is lower than the lower value of the tolerance band at time T2, the slope of the lower boundary may be decreased to pass through P2.

Figure 6:
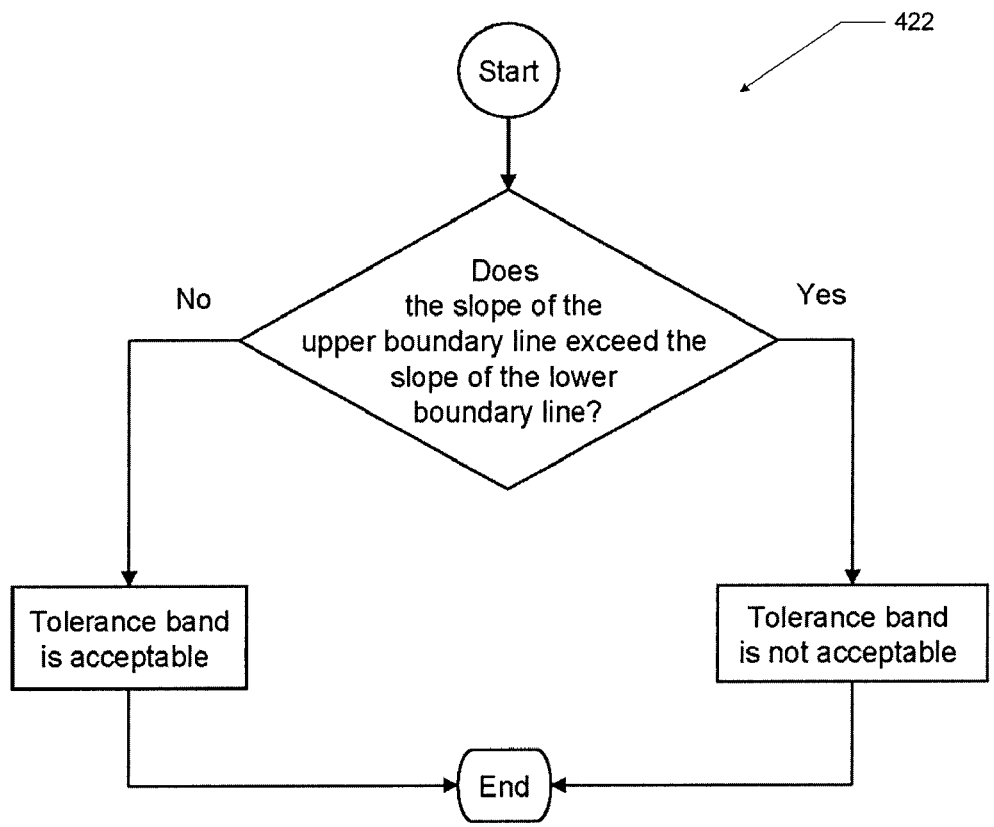

If the slope of either of the tolerance bands is changed, a determination whether an updated tolerance band defined by the upper and lower boundaries is acceptable may be made at 422. For example, as shown at 422 in FIG. 6, if the updated upper and lower boundaries are divergent—that is, if the slope of the upper boundary is greater than the slope of the lower boundary—it may be determined that the adjusted tolerance band is not acceptable, with the result that at 426 a data point corresponding to P2 may be determined and saved to data set 12, and process 44 may be started over again.

A point representing P2 may be determined at 426 by, for example, computing an expected value of the parameter at the middle, or other desired range, of the tolerance band. For example, using the average of the slopes of the upper and lower boundaries, a nominal value of the parameter of interest, $V_{est}$ may be determined and at 46 stored in data set 12. Optionally, $V_{est}$ may be stored together with its associated time T2, and any other desired data, including parameter identifiers and/or actual read values of V2 provided by sensors 16.

After the point representing P2 has been stored at 46, it may be determined whether additional data is to be read, or whether process 40, 400 is complete. If process 40, 400, is to continue, at 50 the expected data point $P_{est}$=(Vest, T3) computed at 426 may be set as the first data point P0, and the process 44 may be repeated until all desired or available data has been read.

Example 1

Referring now to FIGS. 7A-7E, an embodiment of a method of processing data in accordance with the disclosure will be described.

Figure 7A:
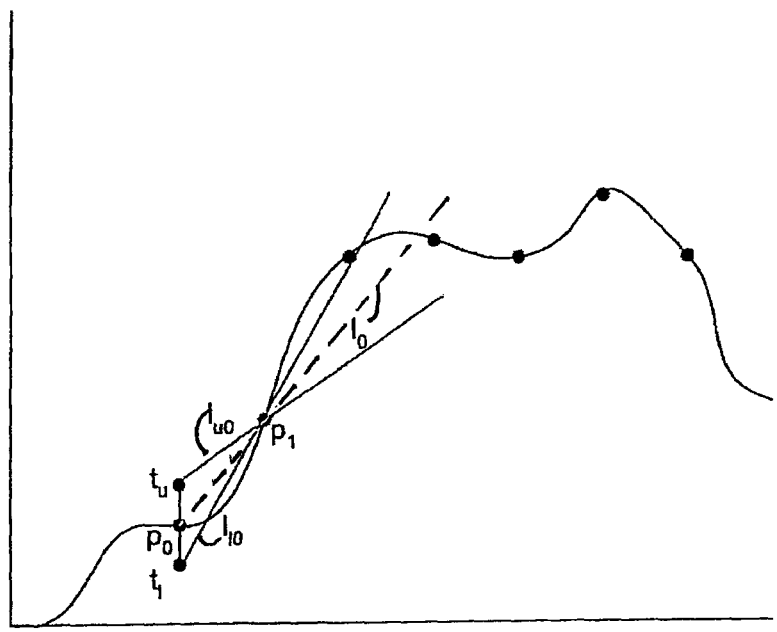
FIGS. 7A-7E are graphical representations illustrating application of steps in accordance with processes such as those illustrated in FIGS. 3 and 4.

Referring first to FIG. 7A, a series of collected measurement data points, P0, P1, P2, P3, P4, etc. are provided. The graph represents the measured value on the vertical axis and time on the horizontal axis. The curve (not indicated) represents a typical polynomial curve fit to the measured (i.e. uncompressed) data set.

Points P0-P4 can, for example, be collected by one or more sensors 14 in real time during, for example, operation of a vehicle such as an aircraft, and may represent one or more operating parameters of systems associated with the vehicle, such as turbofan engine inlet parameters, including for example static and dynamic pressures and temperatures, fan rotating speed(s), shaft torque, oil pressure, fuel flow rate(s), etc. Typically a set of points such as that shown in FIG. 7A would represent data associated with a single such parameter; for additional parameters similar curves could be constructed.

Each point P0, P1, P2, etc., may be represented by a parameter value V0, V1, V2, etc., such as a pressure or temperature, at an associated time T0, T1, T2, as (V0,T0), (V1,T1), etc.

Starting with an initial point (P0) and a next point (P1), processor(s) 18 may calculate parameters of a line ($l_o$) passing through the two points, and the following associated linear slopes:

the slope of an upper boundary line ($l_{u0}$) passing through the initial point's upper tolerance ($t_u$), having a value and the next point (P1), where ($t_u$) may be represented by a value (P0+a predetermined tolerance) at the time T0, and the slope of a lower boundary line ($l_{l0}$) is computed through the initial point's lower tolerance ($t_l$) and the next point (P1), where ($t_u$) may be represented by a value (P1−a predetermined tolerance) at the time T1.

Figure 7B:
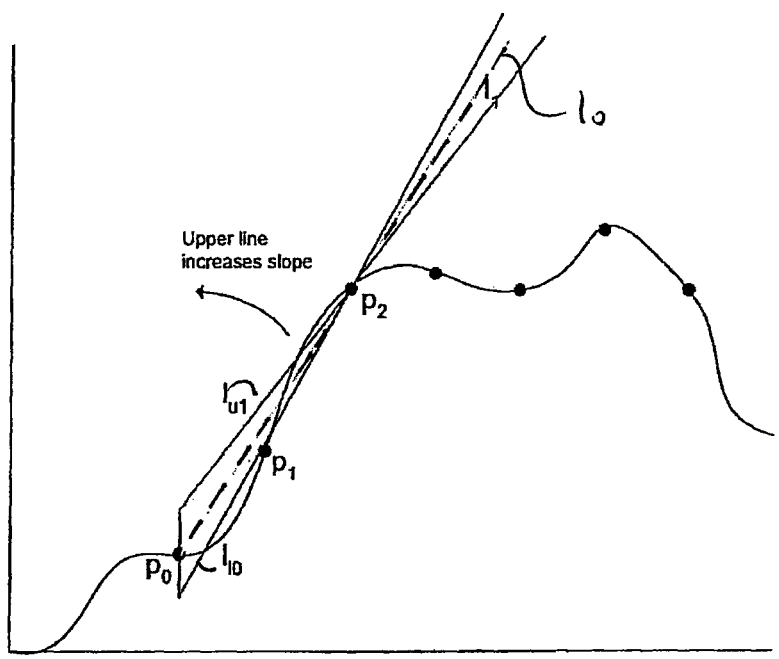

As shown in FIG. 7B, the initial point (P0) and a subsequent point (P2) may be considered, and the following linear slopes calculated:

the slope of an upper boundary line ($l_{u1}$) passing through the initial point P0's upper tolerance ($t_u$) and the subsequent point (P2), and the slope of a lower boundary line passing through the initial point P0's lower tolerance ($t_l$) and the subsequent point (P2).

The average of these two slopes provides a line $l_l$ which commences at P0. The line $l_l$ represents an average slope of the recorded data during the time period T0-T2, and therefore can represent an estimated or anticipated next value of the parameter of interest at a next subsequent time T3.

Comparing the slopes of the two upper boundary lines of FIGS. 7A and 7B (i.e. lines $l_{u0}$ and $L_{u1}$) it may be determined that the slope of $l_{u1}$ is greater than the slope of the line $l_{u0}$. This may be interpreted as meaning that actual parameter values V (whether observed or otherwise) between P0 and P2 are, or were, most likely within the tolerance band as defined of the upper boundary line, because they are contained within the upper and lower boundary lines $l_{u0}$ and $l_{u1}$ as currently defined.

A similar comparison of the slopes of the two lower boundary lines of FIGS. 7A and 7B may be used to determine that the point P2 also falls within a lower expected or acceptable tolerance band 2 is also made, and therefore that P2 remains within the tolerance range. A conclusion may follow that the parameter of interest is behaving within predictable bounds, and there is no change to the lower tolerance line.

It may be noted that, in order to track a tolerance band correctly, the slope of an upper boundary line ($l_{ux}$) may only be permitted to increase, while the slope of the lower boundary line ($l_{1x}$) is only permitted to decrease, before recording a data point as outside an anticipated range and re-setting or re-starting the parameter monitoring process 44. If the calculated slope of a new upper boundary line is less than the upper boundary line calculated for the last point, then the definition of the upper boundary line calculated for the last point may be retained. Likewise, for the lower boundary line, if the calculated slope of a new lower boundary line is greater than the lower boundary line calculated for the last point, then the definition of the lower boundary line calculated for the last point may be retained. In this way, the tolerance band remains accurate within predefined expectations, or tolerances (or thresholds) for the entire set current of points (i.e. P0 to P2, so far, in this example).

Figure 7C:
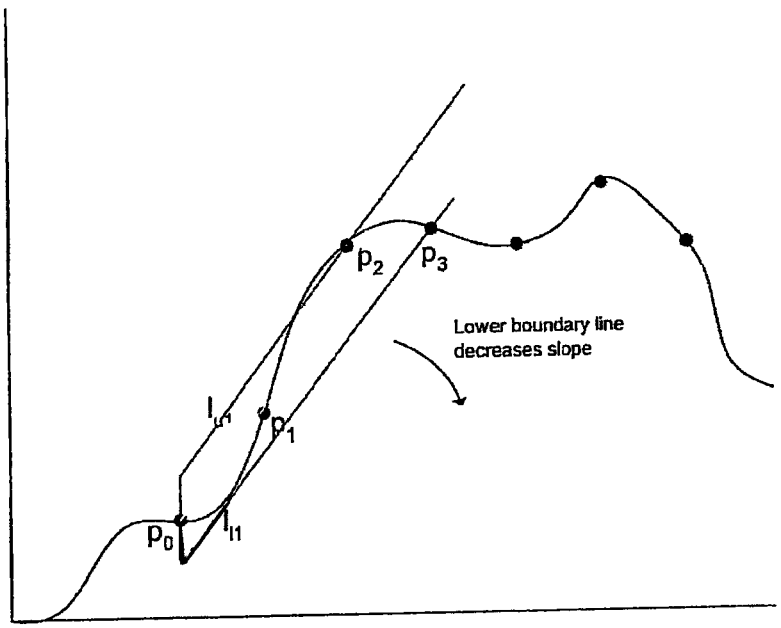
Figure 7D:
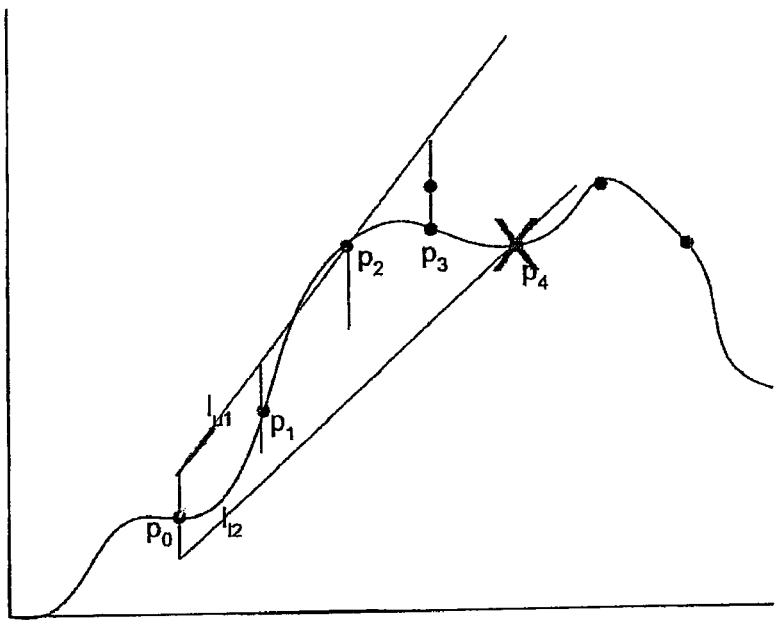

Referring now to FIG. 7C, data determined using the initial point (P0) may be used in considering a next subsequent point P3, and upper and lower boundary parameters, including slopes, are determined (as, for example, described above). In the case of point P3 as shown in FIG. 7C, it can be seen that the lower boundary line ($l_{u1}$) slope decreases to relative to the lower boundary line of FIGS. 1 & 2 ($l_{u0}$). This means that the lower boundary line ($l_{u1}$) may be defined as the new lower tolerance line. However, the upper and lower boundary lines remain within the total tolerance ($t_u$+$t_1$) of each other, since the upper slope value is not greater then the lower slope value (i.e. the boundary lines do not diverge), and all points (P0, P1, P2, P3, P4) are within the tolerance range.

The average of the upper and lower boundary line slopes provides the line $l_2$ which commences at $p_0$. The line $l_2$ represents an average slope of the recorded data during this time period T0-T2, and may be considered to provide a function indicating expected values V of the corresponding parameter of interest, or values V which fall within a predetermined tolerance band.

Referring now to FIG. 7C, a next point P4 may be considered, and tolerance band or tolerance boundary slopes calculated as described above. In the example shown in FIG. 7C, there is no change needed to the upper boundary line ($l_{u1}$) because all previous recorded points still fall within the tolerance band defined by current definitions of the upper and lower boundary lines. However, the updated lower boundary line ($l_{l2}$) has less slope than the previous lower boundary line ($l_{l1}$), and hence a new tolerance would need to be established. However, since the slope of the new lower boundary line ($l_{l2}$) is less than the upper boundary line ($l_{u1}$) slope (i.e. the upper line slope is greater than the lower line slope), this means that the vertical distance from the new point (P4) to the upper or lower line exceeds the tolerance band defined by the slope lines.

Hence, it can be seen that the described method indirectly tests whether a tolerance range has been exceeded by any subsequent data point in a stream or other set of data representing a parameter V of interest for an associated aircraft or other system.

When a current defined value of an upper boundary line slope is greater than the corresponding lower boundary line, method 40, 400 can include retention (e.g., in volatile or persistent memory 20) of the respective values of the tolerances at the time associated with the previously-considered previous point. That is, parameters associated with the new lower boundary line may be disregarded, and the previous lower boundary line and upper boundary line may be averaged to define a line (e.g., $l_3$) which commences at P0. The line $l_3$ represents an average slope of the recorded data during this time period T0-T3. A point P3' (having a value $V3_{est}$) lying on line $l_3$ at time $t_3$ may be determined, and data defining the corresponding line $l_3$ may recorded in the compressed data set 12. The tolerance bands show the relation of the actual points to the recorded line, though this specific tolerance band information need not be recorded. Data representing points P1, P2, P3 may be discarded (i.e., over-written, erased, or otherwise not saved).

A method 40, 400 in accordance with the disclosure may record a data point (as described for example in FIG. 7D) in compressed or relatively reduced data set 12 when the upper and lower boundary lines begin to diverge, e.g., as time goes to infinity. As long as the vertical distance between the lines does not become larger as time increases, the data points contained within those boundary lines are all within the preselected tolerance band relative to the recorded line. Hence, these data points may be discarded without affecting the acceptable accuracy of the retained/compressed data set 12. When a new data point causes the boundary lines to diverge, this indicates that the vertical distance between the lines at that point in time exceeds the pre-selected tolerance, indicating that it is time to record this recorded line, and begin monitoring subsequent points along a new line slope.

The test for divergence is implemented in this example by comparison of the upper and lower boundary line slopes. The threshold condition for saving of a data point to a data set 12 is met when the upper line slope is greater than the lower line slope (i.e. the lower line slope is less than the upper slope), meaning the vertical distance from the new point to the upper or lower line exceeds the tolerance.

Such a method may therefore delete (i.e. over-write or otherwise erase or not save) data points that remain within the tolerance band for the data portion presently under consideration, and thus do not significantly or otherwise undesirably affect the accuracy of the collected data set.

As will be clear to those skilled in the relevant arts, once they have been made familiar with this disclosure, the selection of suitable tolerance values $t_l$, $t_u$ will depend upon the nature of the parameter of interest, and the corresponding system and the requirements it is intended to meet. For critical systems of aircraft and other passenger vehicles, such tolerances may be defined or otherwise predetermined to be relatively low.

Figure 7E:
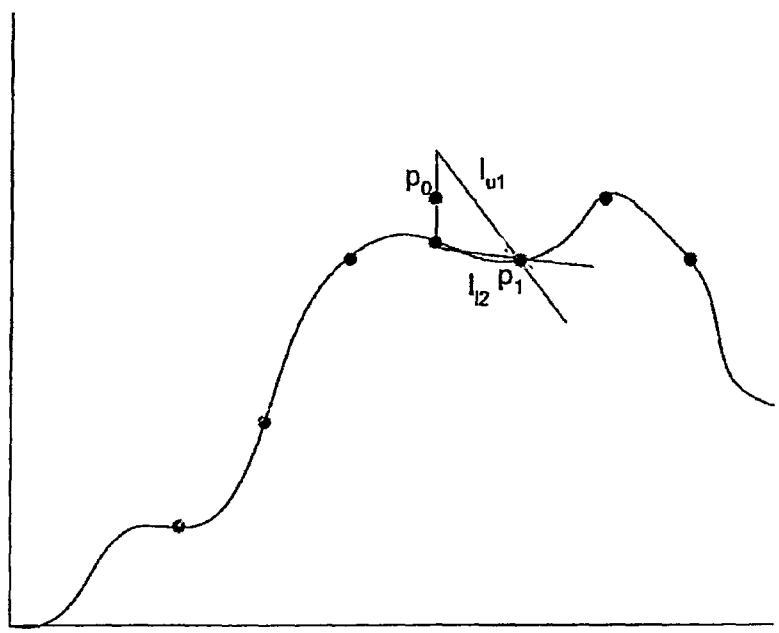

Referring now to FIG. 7E, when the tolerances are exceeded explained above, parameters describing a new line passing through end point of the recorded line P3' are determined, and the above-described process is repeated for the next data segment.

Thus, in the example described, a compressed data set described comprises only two data points, namely P0 and P3', at time T3, rather than P0, P1, P2, P3 and P4. In practice, for the types of systems commonly monitored on aircraft and other vehicles, and making use of predetermined threshold values $t_{l1}$, $t_{u1}$ suitable for use in monitoring such systems, the data reduction achieved may be even greater than described in the example of FIGS. 7A-E. Typical prior art data compression techniques, such as those based on band crossing or other techniques, provide a data size reduction factor of about 4 to 1 on data tested by the inventors. In contrast, reduction using on the present linear curve fitting method may yield a data reduction of approximately 90%, or more, on the same tested data with tolerances equal to the accuracy of the sensors in the measurement system being monitored. Data reduction of this magnitude makes it possible to collect full flight data and yet still transmit it to a ground station within a limited time using limited bandwidth.

As noted above, methods according to this disclosure may be executed on a continuous or continual basis, in real time, as measured data is collected, or after the complete data set has been collected.

As previously noted, selection of suitable tolerance(s) used may be tailored to sensor capability and system application, so that desired accuracy and desired data reduction, or compression, are achieved. By selecting a tolerance comparable to (or less than) the sensor accuracy, the data integrity is not significantly impaired by the present method. The configurable or adjustable tolerance allows the fitted (i.e. compressed) data line to maintain a desired accuracy. When applied to engine condition trend monitoring of an aircraft engine, since the analysis of this type of data often requires less precision than the precision of the engine measurement sensor, significant data compression can be achieved through the selection of a suitable tolerance size.

Thus, a method of monitoring a system of an aircraft or other vehicle in accordance with the invention may comprise automated generation of a stored machine-readable data set 12 by one or more electronic data processor(s) 18 by, among any other desired or suitable steps, with respect to each of one or more parameters of interest represented by signals 16 generated by one or more sensors 14 associated with one or more systems of the aircraft, using data representing a first point (P0) associated with a first parameter value (V0) and a first time (T0), and data representing a second point (P1) associated with a second parameter value (V1) at a second time (T1):

generating data, including data representing an upper boundary slope, defining, as a function of time, an upper boundary passing through the points ((V0 plus a tolerance), T0) and (P1), generating data, including data representing a lower boundary slope, defining, as a function of time, a lower boundary passing through the points ((V0 minus a tolerance), T0) and (P1);

generating data defining an estimated parameter function line passing through P0 and having a slope equal to the average of the slopes of the upper and lower boundaries;

reading data representing a subsequent point (P2) associated with a third parameter value (V2) and a third time (T2), and if the third parameter value V2 is greater than a value (VUB2) associated with a point on the upper boundary at time T2, generating data, including data representing the upper boundary slope, redefining the upper boundary as a function of time passing through the points ((V0 plus a tolerance), T0) and (P2), and if the third parameter value V2 is less than a value (VLB2) associated with a point on the lower boundary at time T2, generating data, including data representing the lower boundary slope, redefining the lower boundary as a function of time passing through the points ((V0 minus a tolerance), T0) and (P2); and if the slope of the upper boundary is greater than the slope of the lower boundary, store data representing an estimated parameter value having a value Vest equal to the value of the estimated parameter function line at time T2 in a stored parameter data set in persistent, computer-readable memory.

Such a method may further comprise the data processor(s) 18 setting data representing P0 equal to data representing P2; reading data representing a subsequent point (P3) associated with a fourth parameter value (V3) and a fourth time (T3); setting data representing P1 equal to data representing P3; and:

generating data, including data representing an upper boundary slope, redefining, as a function of time, an upper boundary passing through the points ((V0 plus a tolerance), T0) and (P1), generating data, including data representing a lower boundary slope, redefining, as a function of time, a lower boundary passing through the points ((V0 minus a tolerance), T0) and (P1);

generating data redefining an estimated parameter function line passing through P0 and having a slope equal to the average of the slopes of the upper and lower boundaries;

reading data representing a subsequent point (P4), associated with a fifth parameter value (V4) and a fifth time (T4);

if the third parameter value V4 is greater than a value (VUB4) associated with a point on the upper boundary at time T4, generating data, including data representing the upper boundary slope, redefining the upper boundary as a function of time passing through the points ((V0 plus a tolerance), T0) and (P4), if the third parameter value V4 is less than a value (VLB4) associated with a point on the lower boundary at time T4, generating data, including data representing the lower boundary slope, redefining the lower boundary as a function of time passing through the points ((V0 minus a tolerance), T0) and (P4), and if the slope of the upper boundary is greater than the slope of the lower boundary, store data representing an estimated parameter value having a value Vest equal to the value of the estimated parameter function line at time T4 in a stored parameter data set in persistent, computer-readable memory.

In such methods, where V2 is neither greater than VUB2 nor less than VLB2, the processor(s) 18 can generate data redefining the estimated parameter function line passing through P0 to have a slope equal to the average of the slopes of the upper and lower boundaries.

Accordingly, the size of data set 12 may be limited to only meaningful data entries and may not include all of the data entries that are included in sensed data 14.

As will be apparent to those skilled in the relevant arts, systems, methods, and coded instruction sets according to the disclosure may be used with particular advantage in any of a very wide variety of aircraft flight control systems and subsystems.

The above description is meant to be exemplary only, and one skilled in the art will recognize that changes may be made to the embodiments described without departing from the scope of the invention disclosed. For example, the method may be used for any suitable data compression and is not limited to aircraft or aircraft engine systems. The described approach(es) may be useful in other motive systems, where performance data is downloaded in discrete intervals (e.g. between trips), or in any other suitable system(s) where data compression is desired. The method uses slopes as a means to determine whether successive data points remain within a specified tolerance range, however, any suitable means for determining whether the tolerance range has been exceeded may be used. It will be understood that any tolerance(s), constant or variable, including zero tolerance, suitable for the application at hand may be used with the present method. It will also be understood that by selecting a tolerance of 0, the method will discard consecutive points with same value, which enables the present method to be used to remove occurrences of a duplicate data from a data set. Still other modifications which fall within the scope of the present invention will be apparent to those skilled in the art, in light of a review of this disclosure. For example, except to the extent necessary or inherent in the processes themselves, no particular order to steps or stages of methods or processes described in this disclosure, including the Figures, is intended or implied. In many cases the order of process steps may be varied without changing the purpose, effect, or import of the methods described. The scope of the invention is to be defined solely by the appended claims, giving due consideration to the doctrine of equivalents and related doctrines.

What is claimed is:

1. A method of monitoring an operating parameter of a system of an aircraft and generating a reduced data set for off-loading from the aircraft, the method performed by one or more processors, the method comprising:

with respect to each of one or more parameters of interest represented by signals generated by one or more sensors associated with one or more systems of the aircraft:

using data representing a first point (P0) associated with a first parameter value (V0) and a first time (T0), and data representing a second point (P1) associated with a second parameter value (V1) at a second time (T1):

generating data, including data representing an upper boundary slope, defining, as a function of time, an upper boundary passing through the points ((V0 plus a tolerance), T0) and (P1);

generating data, including data representing a lower boundary slope, defining, as a function of time, a lower boundary passing through the points ((V0 minus a tolerance), T0) and (P1); and generating data defining an estimated parameter function line passing through P0 and having a slope equal to the average of the slopes of the upper and lower boundaries;

reading data representing a subsequent point (P2) associated with a third parameter value (V2) and a third time (T2); and if the third parameter value V2 is greater than a value (VUB2) associated with a point on the upper boundary at time T2, generating data, including data representing the upper boundary slope, redefining the upper boundary as a function of time passing through the points ((V0 plus a tolerance), T0) and (P2); and if the third parameter value V2 is less than a value (VLB2) associated with a point on the lower boundary at time T2, generating data, including data representing the lower boundary slope, redefining the lower boundary as a function of time passing through the points ((V0 minus a tolerance), T0) and (P2); and if the slope of the upper boundary is not greater than the slope of the lower boundary, generating data redefining the estimated parameter function line passing through P0 and having a slope equal to the average of the slopes of the upper and lower boundaries;

reading data representing a subsequent point (P3) associated with a fourth parameter value (V3) and a fourth time (T3); and if the fourth parameter value V3 is greater than a value (VUB3) associated with a point on the upper boundary at time T3, generating data, including data representing the upper boundary slope, redefining the upper boundary as a function of time passing through the points ((V0 plus a tolerance), T0) and (P3); and if the fourth parameter value V3 is less than a value (VLB3) associated with a point on the lower boundary at time T3, generating data, including data representing the lower boundary slope, redefining the lower boundary as a function of time passing through the points ((V0 minus a tolerance), T0) and (P3);

if the slope of the upper boundary is greater than the slope of the lower boundary:

storing data representing an estimated parameter value having a value Vest equal to the value of the estimated parameter function line at time T2 in a stored parameter data set in persistent, computer-readable memory;

setting data representing P0 equal to data representing the value Vest at time T2;

setting data representing P1 equal to data representing P3;

generating data, including data representing the upper boundary slope, redefining, as a function of time, the upper boundary passing through the points ((V0 plus a tolerance), T0) and (P1);

generating data, including data representing the lower boundary slope, redefining, as a function of time, the lower boundary passing through the points ((V0 minus a tolerance), T0) and (P1); and generating data redefining the estimated parameter function line passing through P0 and having a slope equal to the average of the slopes of the upper and lower boundaries;

causing the data to be off-loaded from the aircraft.

2. The method of claim 1, further comprising:

reading data representing a subsequent point (P4), associated with a fifth parameter value (V4) and a fifth time (T4);

if the third parameter value V4 is greater than a value (VUB4) associated with a point on the upper boundary at time T4, generating data, including data representing the upper boundary slope, redefining the upper boundary as a function of time passing through the points ((V0 plus a tolerance), T0) and (P4);

if the third parameter value V4 is less than a value (VLB4) associated with a point on the lower boundary at time T4, generating data, including data representing the lower boundary slope, redefining the lower boundary as a function of time passing through the points ((V0 minus a tolerance), T0) and (P4);

if the slope of the upper boundary is greater than the slope of the lower boundary, storing data representing an estimated parameter value having a value Vest equal to the value of the estimated parameter function line at time T4 in a stored parameter data set in persistent, computer-readable memory.

3. The method of claim 1, further comprising, if V3 is neither greater than VUB3 nor less than VLB3, generating data redefining the estimated parameter function line passing through P0 to have a slope equal to the average of the slopes of the upper and lower boundaries.

4. A method of generating a reduced stored data set for monitoring one or more aircraft systems and for off-loading from the aircraft, the method performed by one or more processors processing signals generated by one or more sensors associated with one or more aircraft systems, the method comprising:

with respect to each of one or more parameters of interest represented by signals generated by one or more sensors associated with one or more systems of the aircraft:

using data representing a first point (P0) associated with a first parameter value (V0) and a first time (T0), and data representing a second point (P1) associated with a second parameter value (V1) at a second time (T1):

generating data, including data representing an upper boundary slope, defining, as a function of time, an upper boundary passing through the points ((V0 plus a tolerance), T0) and (P1);

generating data, including data representing a lower boundary slope, defining, as a function of time, a lower boundary passing through the points ((V0 minus a tolerance), T0) and (P1); and generating data defining an estimated parameter function line passing through P0 and having a slope equal to the average of the slopes of the upper and lower boundaries;

reading data representing a subsequent point (P2) associated with a third parameter value (V2) and a third time (T2); and if the third parameter value V2 is greater than a value (VUB2) associated with a point on the upper boundary at time T2, generating data, including data representing the upper boundary slope, redefining the upper boundary as a function of time passing through the points ((V0 plus a tolerance), T0) and (P2); and if the third parameter value V2 is less than a value (VLB2) associated with a point on the lower boundary at time T2, generating data, including data representing the lower boundary slope, redefining the lower boundary as a function of time passing through the points ((V0 minus a tolerance), T0) and (P2); and if the slope of the upper boundary is not greater than the slope of the lower boundary, generating data redefining the estimated parameter function line passing through P0 and having a slope equal to the average of the slopes of the upper and lower boundaries; and reading data representing a subsequent point (P3) associated with a fourth parameter value (V3) and a fourth time (T3), and if the fourth parameter value V3 is greater than a value (VUB3) associated with a point on the upper boundary at time T3, generating data, including data representing the upper boundary slope, redefining the upper boundary as a function of time passing through the points ((V0 plus a tolerance), T0) and (P3); and if the fourth parameter value V3 is less than a value (VLB3) associated with a point on the lower boundary at time T3, generating data, including data representing the lower boundary slope, redefining the lower boundary as a function of time passing through the points ((V0 minus a tolerance), T0) and (P3);
if the slope of the upper boundary is greater than the slope of the lower boundary:
storing data representing an estimated parameter value having a value Vest equal to the value of the estimated parameter function line at time T2 in a stored parameter data set in persistent, computer-readable memory;
setting data representing P0 equal to data representing the value Vest at time T2;
setting data representing P1 equal to data representing P3;
generating data, including data representing the upper boundary slope, redefining, as a function of time, the upper boundary passing through the Points ((V0 plus a tolerance), T0) and (P1);
generating data, including data representing the lower boundary slope, redefining, as a function of time, the lower boundary passing through the points ((V0 minus a tolerance), T0) and (P1); and
generating data redefining the estimated parameter function line passing through P0 and having a slope equal to the average of the slopes of the upper and lower boundaries.

5. The method of claim 4, further comprising:
reading data representing a subsequent point (P4), associated with a fifth parameter value (V4) and a fifth time (T4);
if the third parameter value V4 is greater than a value (VUB4) associated with a point on the upper boundary at time T4, generating data, including data representing the upper boundary slope, redefining the upper boundary as a function of time passing through the points ((V0 plus a tolerance), T0) and (P4);
if the third parameter value V4 is less than a value (VLB4) associated with a point on the lower boundary at time T4, generating data, including data representing the lower boundary slope, redefining the lower boundary as a function of time passing through the points ((V0 minus a tolerance), T0) and (P4);
if the slope of the upper boundary is greater than the slope of the lower boundary, storing data representing an estimated parameter value having a value Vest equal to the value of the estimated parameter function line at time T4 in a stored parameter data set in persistent, computer-readable memory.

6. The method of claim 1, further comprising, if V3 is neither greater than VUB3 nor less than VLB2, generating data redefining the estimated parameter function line passing through P0 to have a slope equal to the average of the slopes of the upper and lower boundaries.

7. A non-transient computer-readable medium or media comprising data representing coded instruction sets for monitoring one or more aircraft systems and generating a reduced data set for off-loading from the aircraft, the coded instruction sets being configured for causing one or more processors to:
with respect to each of one or more parameters of interest represented by signals generated by one or more sensors associated with one or more systems of the aircraft:
using data representing a first point (P0) associated with a first parameter value (V0) and a first time (T0), and data representing a second point (P1) associated with a second parameter value (V1) at a second time (T1):
generate data, including data representing an upper boundary slope, defining, as a function of time, an upper boundary passing through the points ((V0 plus a tolerance), T0) and (P1);
generate data, including data representing a lower boundary slope, defining, as a function of time, a lower boundary passing through the points ((V0 minus a tolerance), T0) and (P1); and
generate data defining an estimated parameter function line passing through P0 and having a slope equal to the average of the slopes of the upper and lower boundaries;
read data representing a subsequent point (P2) associated with a third parameter value (V2) and a third time (T2); and
if the third parameter value V2 is greater than a value (VUB2) associated with a point on the upper boundary at time T2, generate data, including data representing the upper boundary slope, redefining the upper boundary as a function of time passing through the points ((V0 plus a tolerance), T0) and (P2); and
if the third parameter value V2 is less than a value (VLB2) associated with a point on the lower boundary at time T2, generate data, including data representing the lower boundary slope, redefining the lower boundary as a function of time passing through the points ((V0 minus a tolerance), T0) and (P2); and
if the slope of the upper boundary is not greater than the slope of the lower boundary, generating data redefining the estimated parameter function line passing through P0 and having a slope equal to the average of the slopes of the upper and lower boundaries; and
read data representing a subsequent point (P3) associated with a fourth parameter value (V3) and a fourth time (T3); and
if the fourth parameter value V3 is greater than a value (VUB3) associated with a point on the upper boundary at time T3, generate data, including data representing the upper boundary slope, redefining the upper boundary as a function of time passing through the points ((V0 plus a tolerance), T0) and (P3); and
if the fourth parameter value V3 is less than a value (VLB3) associated with a point on the lower boundary at time T3, generate data, including data representing the lower boundary slope, redefining the lower boundary as a function of time passing through the points ((V0 minus a tolerance), T0) and (P3);
if the slope of the upper boundary is greater than the slope of the lower boundary:
store data representing an estimated parameter value having a value Vest equal to the value of the estimated parameter function line at time T2 in a stored parameter data set in persistent, computer-readable memory;
set data representing P0 equal to data representing the value Vest at time T2;
set data representing P1 equal to data representing P3;
generate data, including data representing the upper boundary slope, redefining, as a function of time, the upper boundary passing through the points ((V0 plus a tolerance), T0) and (P1);
generate data, including data representing the lower boundary slope, redefining, as a function of time, the lower boundary passing through the points ((V0 minus a tolerance), T0) and (P1); and generate data redefining the estimated parameter function line passing through P0 and having a slope equal to the average of the slopes of the upper and lower boundaries.

8. The medium or media of claim 6, wherein the instructions are further configured for causing the one or more data processors to:

read data representing a subsequent point (P4), associated with a fifth parameter value (V4) and a fifth time (T4);

if the third parameter value V4 is greater than a value (VUB4) associated with a point on the upper boundary at time T4, generate data, including data representing the upper boundary slope, redefining the upper boundary as a function of time passing through the points ((V0 plus a tolerance), T0) and (P4);

if the third parameter value V4 is less than a value (VLB4) associated with a point on the lower boundary at time T4, generate data, including data representing the lower boundary slope, redefining the lower boundary as a function of time passing through the points ((V0 minus a tolerance), T0) and (P4); and if the slope of the upper boundary is greater than the slope of the lower boundary, store data representing an estimated parameter value having a value Vest equal to the value of the estimated parameter function line at time T4 in a stored parameter data set in persistent, computer-readable memory.

9. The medium or media of claim 7, wherein the instructions are further configured for causing the one or more data processors to, if V3 is neither greater than VUB3 nor less than VLB3, generate data redefining the estimated parameter function line passing through P0 to have a slope equal to the average of the slopes of the upper and lower boundaries.

* * * * *